United States Patent [19]

Tsuchida et al.

[11] Patent Number: 5,222,038
[45] Date of Patent: Jun. 22, 1993

[54] DYNAMIC RANDOM ACCESS MEMORY WITH ENHANCED SENSE-AMPLIFIER CIRCUIT

[75] Inventors: Kenji Tsuchida, Kawasaki; Yukihito Oowaki, Yokohama; Daisaburo Takashima, Kawasaki, all of Japan

[73] Assignee: Kabushiki Kaisha Toshiba, Kawasaki, Japan

[21] Appl. No.: 782,340

[22] Filed: Oct. 24, 1991

Related U.S. Application Data

[63] Continuation-in-part of Ser. No. 536,718, Jun. 12, 1990, Pat. No. 5,084,842.

[30] Foreign Application Priority Data

Jun. 13, 1989 [JP] Japan .................................. 1-148448
Feb. 1, 1991 [JP] Japan .................................. 3-032466

[51] Int. Cl.⁵ .......................................... G11C 13/00
[52] U.S. Cl. .................................. 365/204; 365/203; 365/230.01
[58] Field of Search ............... 365/230.01, 51, 63, 365/72, 205, 207, 208, 204

[56] References Cited

U.S. PATENT DOCUMENTS 4,803,664  2/1989  Itoh ................................ 365/210
5,084,842  1/1992  Tsuchida et al. .................. 365/204

Primary Examiner—Terrell W. Fears
Attorney, Agent, or Firm—Oblon, Spivak, McClelland, Maier & Neustadt

[57] ABSTRACT

A dynamic random-access memory includes a plurality of spaced-apart memory cell blocks each of said memory cell blocks including rows and columns of memory cells arranged in a matrix on a substrate. Bit lines and word lines are connected to the rows and columns of memory cells in each cell block. PMOS sense amplifier sections and NMOS sense amplifier sections are associated with the memory cell blocks respectively. PMOS driver transistors for the PMOS sense amplifier sections are distributed among the PMOS sense amplifier sections such that a PMOS transistor is located between every two neighboring PMOS sense amplifier sections. NMOS driver transistors for the NMOS sense amplifier sections are distributed among the NMOS sense amplifier sections such that a NMOS transistor is located between every two neighboring NMOS sense amplifier sections. Source voltage supply lines extend in a corresponding word-line snap region between two neighboring cell blocks, and are connected to the PMOS and NMOS driver transistors, for supplying these transistors with a first and a second source voltage independently of each other.

17 Claims, 13 Drawing Sheets

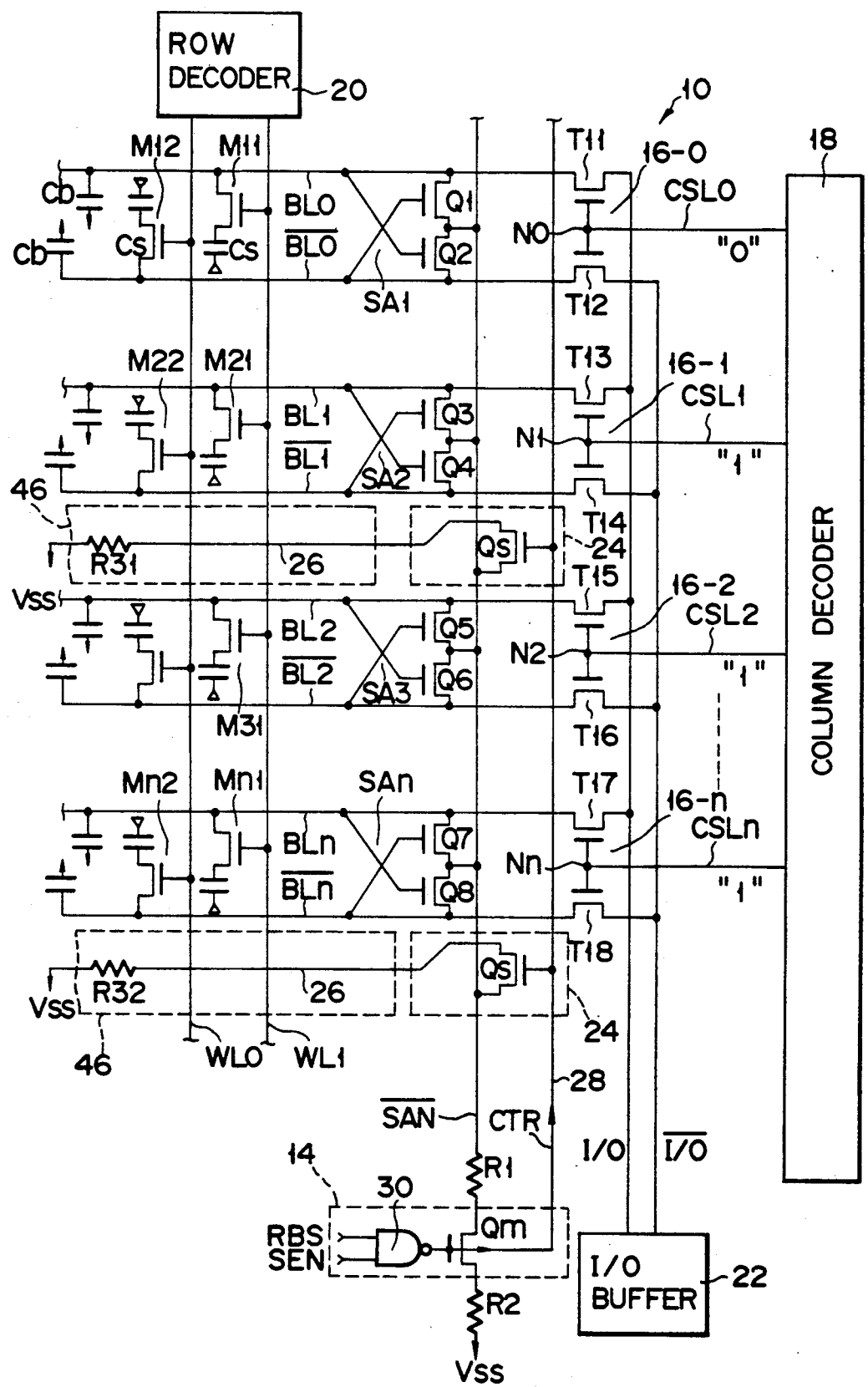
F I G. 1

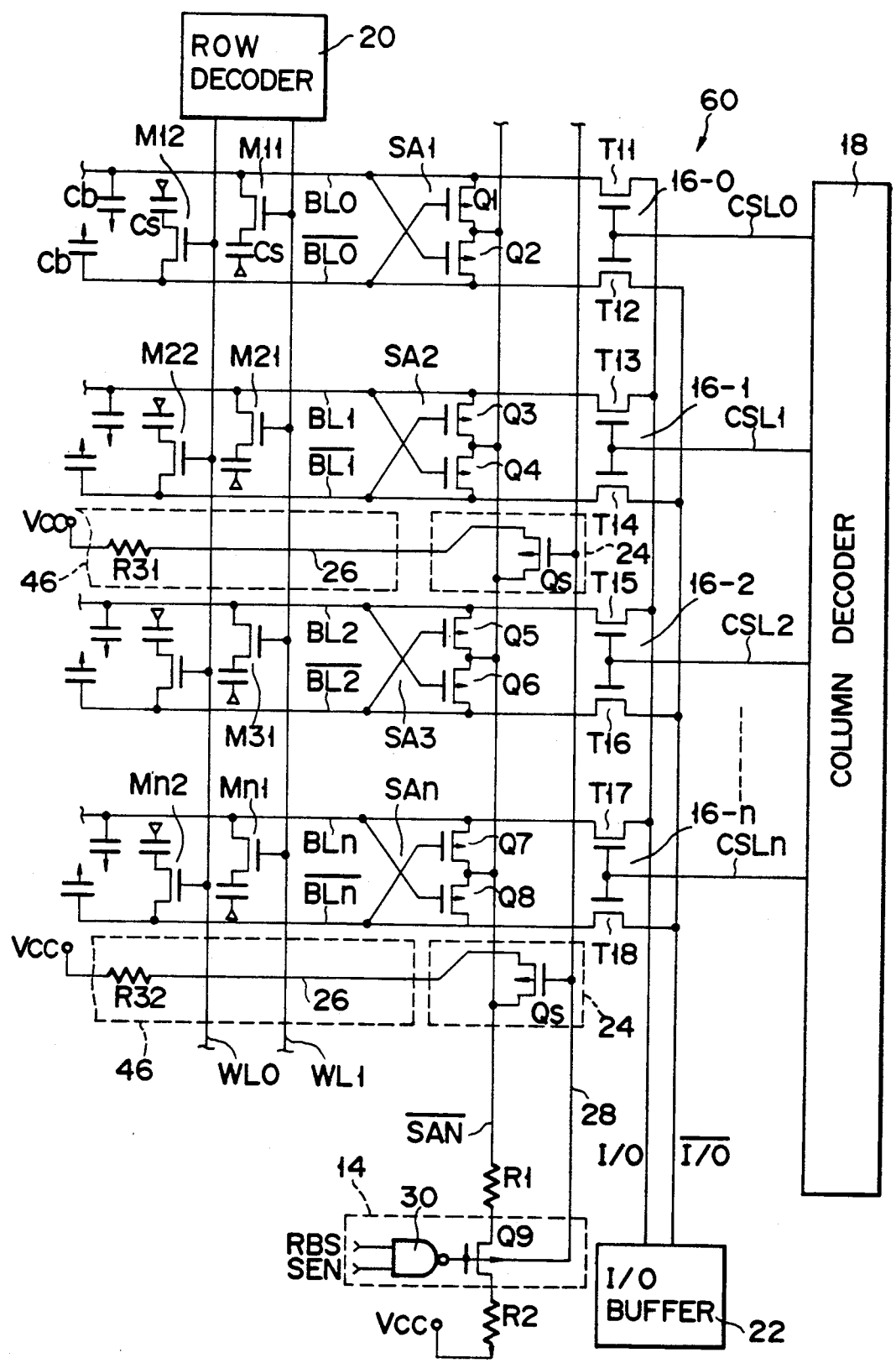
F I G. 5

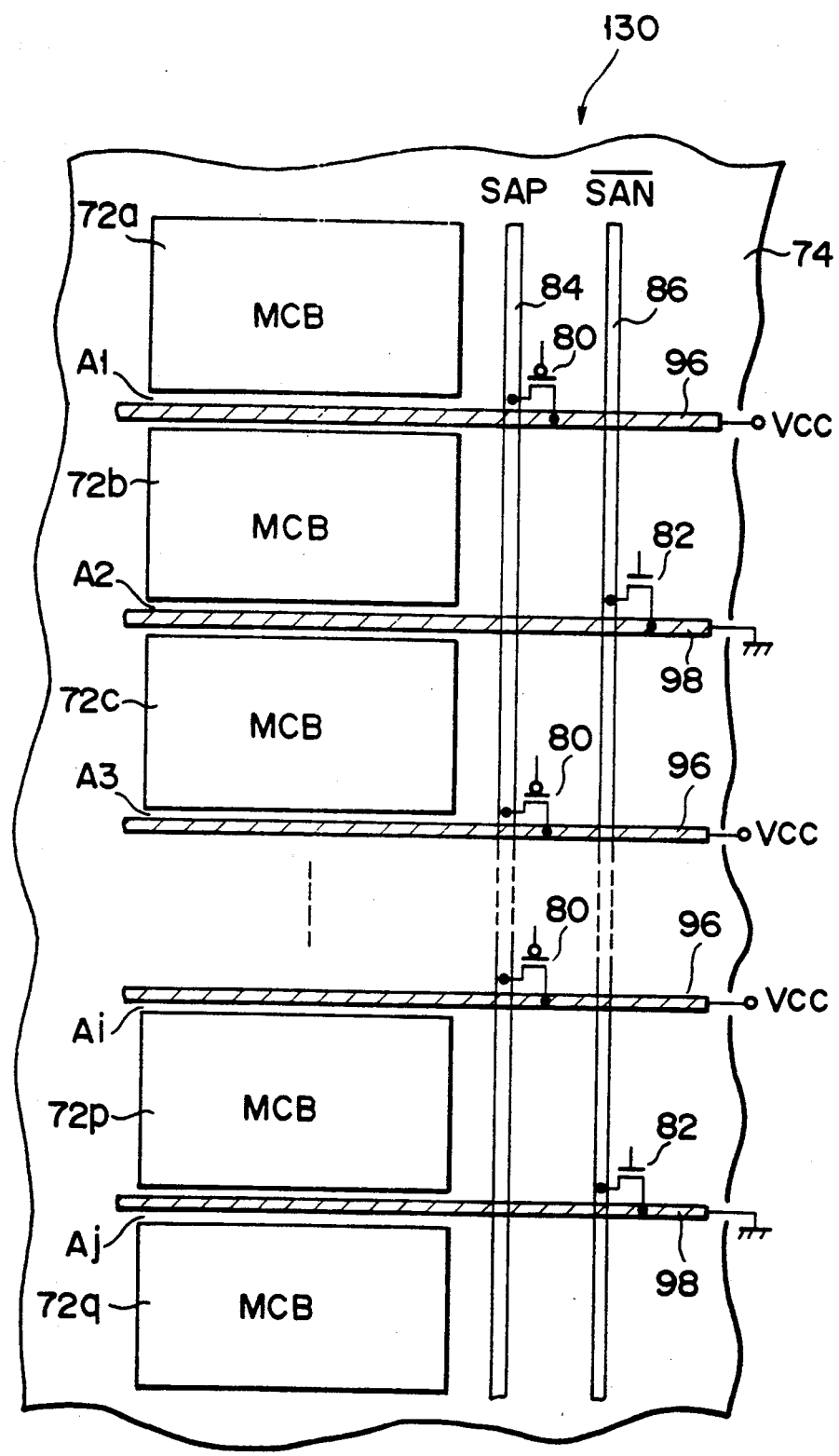
F I G. 13

DYNAMIC RANDOM ACCESS MEMORY WITH ENHANCED SENSE-AMPLIFIER CIRCUIT

BACKGROUND OF THE INVENTION

This is a continuation-in-part application of the U.S. patent application Ser. No. 536,718, filed Jun. 12, 1990, now U.S. Pat. No. 5,084,842.

1. Field of the Invention

The present invention relates to semiconductor memory devices, and more particularly, to dynamic random access memories (DRAMs) having memory cells each comprising one transistor and one capacitor.

2. Description of the Related Art

Of semiconductor memory devices having metal oxide semiconductor (MOS) transistors integrated on a chip substrate, DRAMs having a memory structure with one transistor and one capacitor are most suitable for high integration due to their small memory-cell occupying area. DRAMs of several megabits to several tens of megabits fabricated according to an advanced micro-fabrication using a submicron working technique dealing with the minimum work size of 1 micrometer or less have recently been announced and will be mass-produced in near future.

There is a strong demand of higher operational speed for such highly integrated DRAMs. With the state-of-the-art technology, however, the operational speed cannot be further increased by improving the switching speed of micro-fabricated MOS transistors alone. This is because the micro-fabrication of MOS transistors is naturally limited, and the super micro-fabrication technique, which has already been developed, requires a special fabrication process and there is no little risk for semiconductor manufacturers in applying this technique to mass production of semiconductor devices at the present stage.

It is well known among those skilled in the art that the operational speed of DRAMs or reading/writing speed to access data is principally dependent on the sense time required to detect (or sense) memory cell data and amplify it. This sense time is influenced greatly by a data writing pattern in a memory array; the sense time for devices is generally specified by the length of time required for the data reading pattern under the worst conditions.

The most typical "data reading pattern under the worst conditions" would be such that paying attention to an array of memory cells respectively included in plural pairs of data transmission lines, called the "bit line pairs," and arranged along, and associated with, a certain data row control line, called the "word line," data stored in a selected memory cell in the array is of logical "0" and data of logical "1" is stored in all the remaining memory cells. Such a data storage pattern is generally called the "column bar pattern."

In this case, a discharge current flowing from bit lines connected with non-selected memory cells into a common source line commonly provided to the bit line pairs before discharge current flows into the bit line connected with the selected memory cell (this current will be hereinafter called "read discharge current") becomes largest. An increase in such a read discharge current delays the sensing operation in a sense amplifier section connected to the common source line for the following reasons.

As the common source line extends in parallel to the word lines above the chip substrate, its line resistance is obviously large. The greater the memory integration of a DRAM, the greater the number of the bit line pairs associated with the common source line, thus further increasing the line resistance of the common source line as well as the capacitance thereof. In other words, the discharge time constant of the common source line becomes relatively large. Under such circumstances, an increase in the read discharge current increases the time required for the discharge current in the read operation to quench. The sense operation for a selected memory cell is executed after a certain length of time has elapsed since the discharge current starts to flow in the bit line connected to the remaining, non-selected memory cells in order. The timing of driving a column select line for the selected cell is therefore significantly delayed. This inevitably increases the total time required to complete the logical discrimination of data stored in the selected memory cell, which is simply the actual time required for the sense operation for the selected cell. Such a delay in timing of driving the column select line in the case of the column bar pattern considerably hinders the high speed data accessing operation of a DRAM, which raises a significant problem.

SUMMARY OF THE INVENTION

It is therefore an object of the present invention to provide a new and improved dynamic semiconductor memory device.

It is another object of the present invention to provide a new and improved dynamic random access memory device which can maximize the data access speed without degrading its memory integration density and which can be manufactured using a presently available micro-fabrication technique.

In accordance with the above objects, the present invention is addressed to a specific dynamic random access memory which has a substrate, parallel bit lines provided on the substrate, parallel word lines insulatively crossing the bit lines on the substrate to define cross points therebetween, and memory cells provided at the cross points. Each of these memory cells has a data storage capacitor and a transistor. A sense amplifier circuit section is connected to the bit lines, for sensing a data voltage. A discharge control section is associated with the sense amplifier circuit section, for forming a discharge path branched between the bit lines and a ground potential when a certain word line is specified and a memory cell is selected from those memory cells connected to the certain word line, thereby progressing discharging of charges.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a schematic diagram illustrating the internal circuit configuration of a dynamic random access memory (DRAM) according to one preferred embodiment of the present invention.

FIG. 5 is a schematic diagram illustrating the internal circuit configuration of a DRAM according to another embodiment of the present invention.

FIGS. 12 and 13 are diagrams respectively showing plan views of the main sections of DRAMs in accordance with still further embodiments of this invention.

DETAILED DESCRIPTION OF THE PREFERRED EMBODIMENTS

Figure 2:
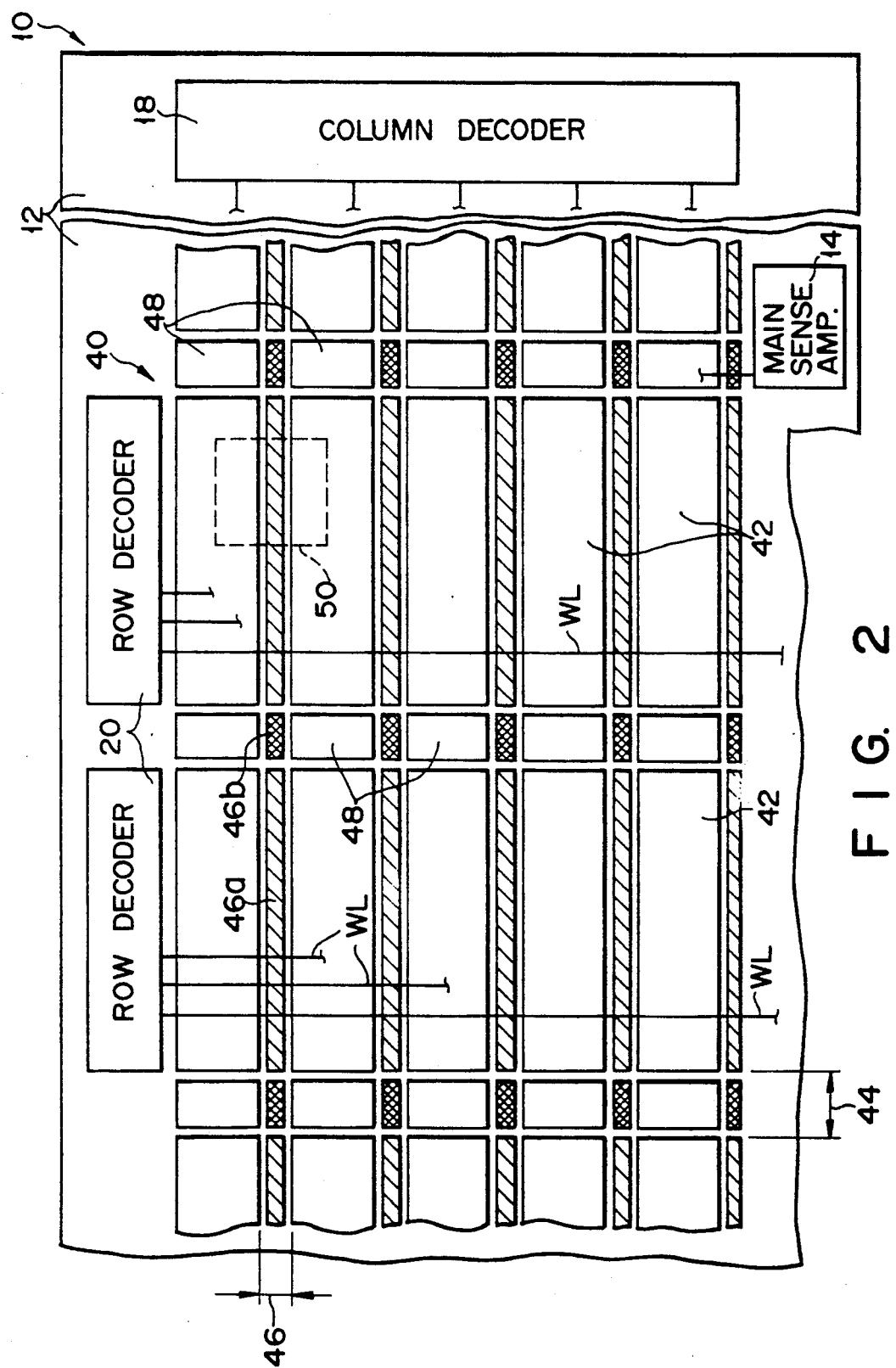
FIG. 2 is a diagram presenting a plane view of the essential portion of the DRAM in FIG. 1 including a memory section.
Figure 3:
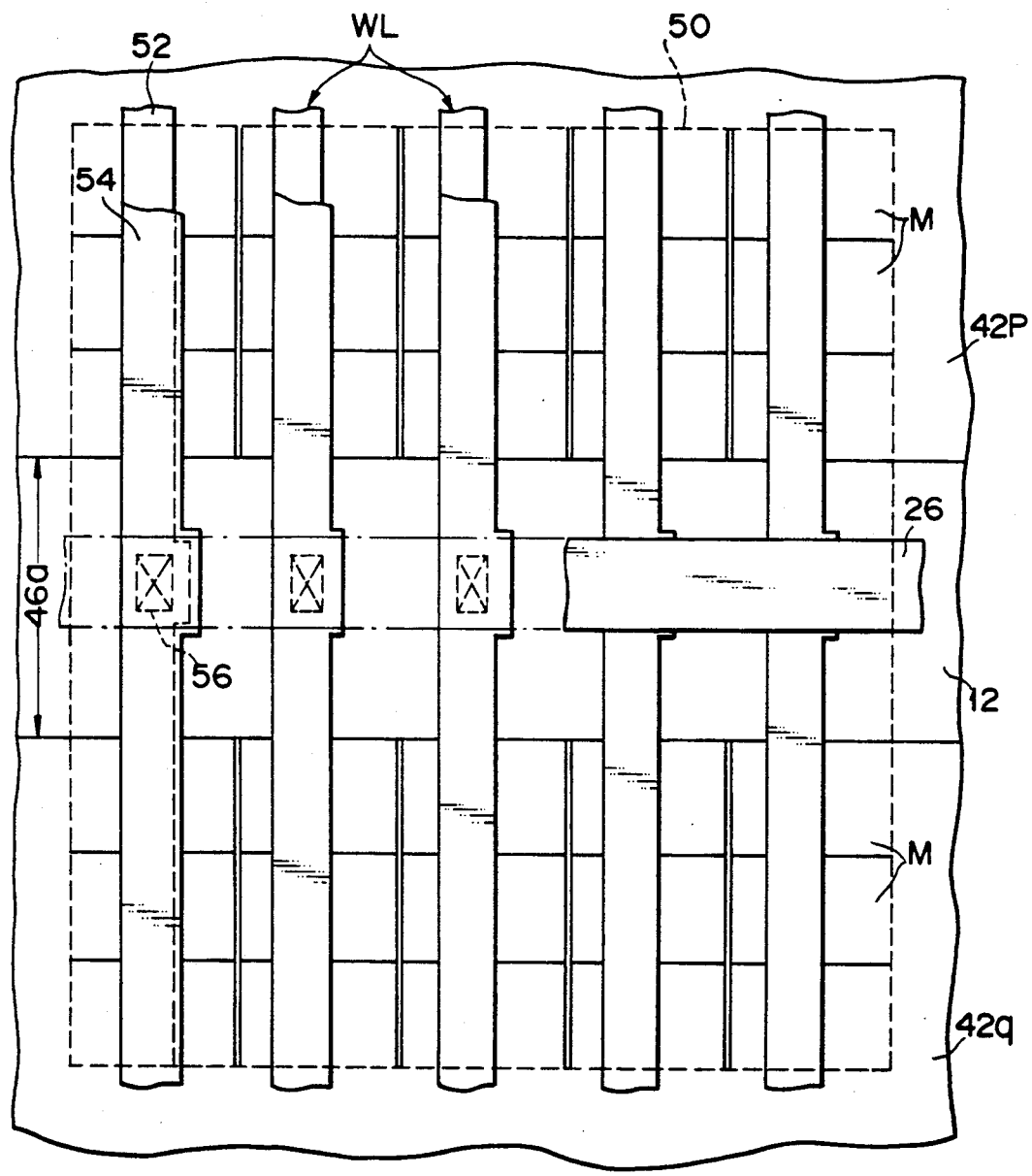
FIG. 3 is an enlarged, deformed diagram of a plane pattern of part of the plane structure of the DRAM in FIG. 2 for easier understanding.

In FIG. 1, a DRAM according to one preferred embodiment of the present invention is generally designated by reference numeral "10." The DRAM 10 has a first preselected number of bit line pairs BL, $\overline{BL}$ on a chip substrate 12 (which is shown in FIG. 2 or 3). Each bit line pair has first data transmission lines BLi (i=1, 2, ..., n) and second data transmission lines $\overline{BLi}$ (i=0, 1, 2, ..., n), which are parallel to one another. There are a second preselected number of word lines WL which insulatively cross or intersect bit line pairs BL, $\overline{BL}$, although FIG. 1 only shows two word lines WL0, WL1 for the purpose of illustration.

Memory cells M11, M12, ... are provided at the cross points between each word line WLj (j=0, 2, ..., n) and the first data transmission lines BL0, BL1, BL2, ..., BLn. Each of the memory cells has a well know structure with one MOS transistor and one MOS capacitor, as shown in FIG. 1. In FIG. 1, the capacitances of the memory cell capacitors are indicated here and there by "Cs," and the line capacitances of each bit line pair BLi, $\overline{BLi}$ by "Cb."

As shown in FIG. 1, bit line pairs BL, $\overline{BL}$ are respectively provided with sense amplifiers SA1, SA2, SA3, ..., SAn. Each sense amplifier SAi has two MOS transistors Q connected as illustrated. For instance, sense amplifier SA1 has two series-connected MOSFETs Q1 and Q2, MOSFET Q1 having its gate connected to bit line BL0 and the other MOSFET Q2 having its gate connected to bit line $\overline{BL0}$. The other sense amplifiers SA2, SA3, ..., SAn have the same structure except for different reference numerals given to their MOSFETs. The series-circuits of MOSFETs Q of bit line pairs BL, $\overline{BL}$ have their common nodes connected together to a common source line $\overline{SAN}$, which is connected to a main sense amplifier driver 14.

The bit line pairs BL, $\overline{BL}$ are also provided with column select gate circuits 16-0, 16-1, 16-2, ..., 16-n, respectively. Each column select gate circuit 16-i has two MOSFETs Ti, T(i+1), the former connected to bit line BLi of the corresponding bit line pair BL and the other connected to the remaining bit line $\overline{BL}$. For instance, in column select gate circuit 16-0 of bit line pair BL0, $\overline{BL0}$, MOSFETs T11 is connected to bit line BL0 while MOSFET T12 is connected to he bit line $\overline{BL0}$. These MOSFETs T11, T12 have their gates connected together. The same is true of the remaining column select gate circuits 16-1, 16-2, ..., 16-n. The column select gate circuits 16-0, 16-1, 16-2, ..., 16-2 have their common gate nodes N0, N1, N2, ..., Nn connected through column select lines CSL0, CSL1, CSLn to the respective outputs of a column decoder 18. The column select gate circuits 16 may be driven independently in response to column select control signals CSL from column decoder 18. Word lines WL are connected to the outputs of a row decoder 20 and are selectively designated or activated by this decoder.

As shown in FIG. 1, n bit line pairs BL, $\overline{BL}$ are connected to a pair of data input/output lines I/O, $\overline{I/O}$, which are connected to an input/output data buffer 22.

It should be noted that the main sense amplifier driver 14 is additionally provided with a preselected number of subsense amplifier drivers 24 and the common source line $\overline{SAN}$ is connected not only to the main sense amplifier driver 14 but also to these subsense amplifier drivers 24. Each subsense amplifier driver 24 includes a switching transistor Qs, such as a MOSFET. This MOSFET has its source is connected through a potential applying line 26 to a predetermined potential, for example, a substrate potential Vss and its drain connected to common source line $\overline{SAN}$. The potential applying line 26 is grounded. The MOSFETs Qs of subsense amplifier drivers 24 have their gates commonly connected to a gate control line 28, which is connected to main sense amplifier driver 14. Accordingly, these MOSFETs Qs are turned on or off at the same time in response to an output from main sense amplifier driver 14.

As shown in FIG. 1, the main sense amplifier driver 14 includes a logic circuit 30 called an "AND gate" which acquires a logical product. The AND gate 30 receives a row block select signal RBS at one input and receives a sense amplifier activate signal SEN at the other input. The AND gate 30 has its output connected to the gate of a switching transistor Qm constituted by a MOSFET. The MOSFETs Qm has its drain connected to common source line $\overline{SAN}$ and its source connected to the substrate potential Vss, ground potential, for example. Referring to FIG. 1, resistors R1, R2 represent equivalent line resistors. Equivalent line resistors of the potential applying lines 26 are respectively designated by reference numerals "R31" and "R32."

Additional provision of the subsense amplifier drivers 24 principally gives bit line pairs BL, $\overline{BL}$ an extra discharge current paths, which will be explained later.

Referring now to FIG. 2, a memory region 40 is defined on the chip substrate 12 of DRAM 10. The aforementioned decoder circuits 18, 20 are arranged around this region 40. Memory cell subblocks 42 having a rectangular plane outline are orderly arranged in a matrix form in memory region 40. Each memory cell subblock 42 includes memory cells associated with a predetermined number of bit line pairs BL, $\overline{BL}$ as shown in FIG. 1. The word lines WL0, WL1, ... come out from row decoders 20 for each column address.

Gap regions 44 remain between the memory cell subblocks 42 in the row direction, and gap regions 46 exist therebetween in the column direction. Sense amplifier regions 48 are defined in most of column gap regions 44. Each sense amplifier region 48 includes the main sense amplifier drivers 14 for bit line pairs BL, $\overline{BL}$ of the associated memory cell subblocks 42.

The row gap regions 46 are generally called "snap regions" in the related field, where contact portions for word lines WL are to be provided. Obviously, these gap regions 46 do not contribute at all to the layout of the memory cells of DRAM 10, and are used only to provide the contact portions for word lines WL but used in no other way. Each row gap region 46 has gap regions 46a between cell subblocks, hatched in oblique lines in FIG. 2 for the sake of convenience, and gap regions 46b between sense amplifiers, hatched in mesh. As no word lines WL are principally arranged above gap regions 46b, these gap regions 46b may be considered "dead space" which is of no use for the time being.

It should be noted that the subsense amplifier drivers 24, explained referring to FIG. 1, are laid out particularly using these "dead space" regions 46b and the potential applying lines 26 associated with drivers 24 are arranged in the regions 46a. With such an arrangement, the newly added subsense amplifier drivers 24 and potential applying lines 26 can be laid out on chip substrate 12 very practically without the need to unnecessarily increase the size of chip substrate 12 and without using a special design technique of micro-fabricating a wiring pattern.

The plane patterning structure of a square area 50 indicated by the broken-line block in FIG. 2 is illustrated in detail in FIG. 3. Two neighboring memory cell blocks, say 42p, 42q, facing each other with row gap region 46 in between, have a plurality of rectangular 1-bit memory cells M, which are arranged closely in gap 46. The word lines WL run straight above the memory cells M. Each word line WL has a double-layered structure, which has a polycrystalline silicon layer 52 and an aluminum layer 54 insulatively stacked thereabove in this embodiment. Referring to FIG. 3, the underlying layer 52 is narrower than the overlying layer 54 rather for the purpose of emphasis for clearer illustration than as a result of the limitation of the electron beam focusing for patterning in the actual fabrication process.

A contact portion 56 is formed for each word line WL to render the overlying layer 54 and the underlying layer 52 mutually conductive. The aforementioned region 46b of row gap region 46 is required for the layout of contact portions 56 on substrate 12. As shown in FIG. 3, potential applying line 26 is provided above the line of contact portions 56, and subsense amplifier drivers 24 are arranged particularly in the "dead space" region 46b surrounded by sense amplifier regions 48 and regions 46a, as shown in FIG. 2. It is therefore quite unnecessary to specially spare some of the precious substrate area for those additional constituting elements, which would result in reduction in memory integration. The potential applying lines 26 can be simultaneously formed through patterning from a metal layer that forms either bit line pairs BL, $\overline{BL}$ or column select lines CSL of DRAM 10. This means that there is no need to add an extra patterning layer to form potential applying lines 26.

A description will now be given of the data reading operation in the typical "column bar pattern" in DRAM 10. Suppose that, as an example of the "column bar pattern," a certain row address, e.g., word line WL1, is designated, and data of logical "0" is sensed in the column of bit line pair BL0, $\overline{BL0}$ while data of logical "1" is sensed in all the remaining columns along the designated row address. This is the "worst case" for the data reading or the case for the lowest data accessing speed.

As shown in FIG. 4, the word line WL1 is selected at time t0 and the sense operation starts at time t1. At this time, MOSFET Qm of main sense amplifier driver 14 is turned on, in response to which MOSFETs Qs of subsense amplifier drivers 24 are simultaneously turned on. The MOSFETs Qs of subsense amplifier drivers 24 are simultaneously turned on to be rendered conductive in response to a switch control signal CTR from main sense amplifier driver 14. The common source line $\overline{SAN}$ is connected at a plurality of sections to the ground potential Vss through MOSFETs Qs and lines 26. In other words, common source line $\overline{SAN}$ has a plurality of discharge paths.

Figure 4A:
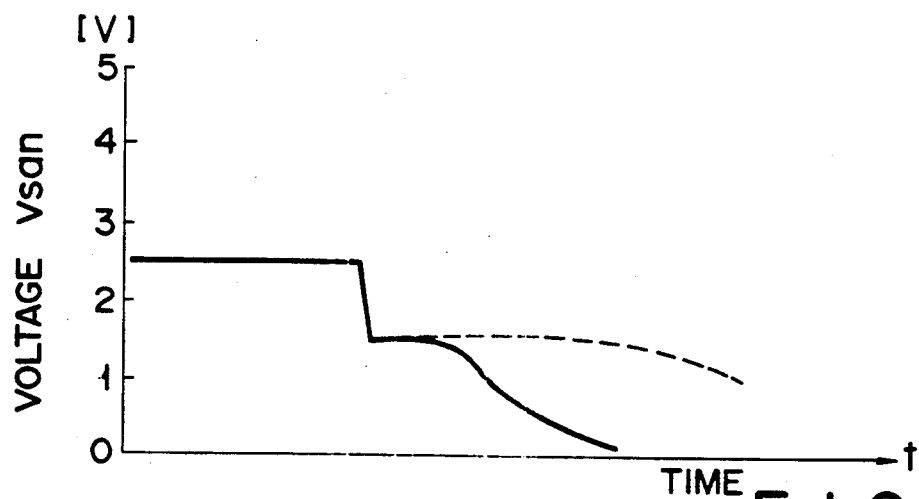
FIGS. 4A to 4C are graphs showing waveforms of electric signals generated at the essential portions in essential operation modes in the embodiment as shown in FIGS. 1 through 3.

When MOSFETs Q4, Q6, ..., Q8 of sense amplifiers SA2, SA3, ..., SAn in the column with data of logical "1" are turned on, the charges on bit lines BL1, BL2, ..., BLn to which these MOSFETs Q are connected are rapidly discharged to substrate 12 via the discharge paths of common source line $\overline{SAN}$. The discharging of the charges is accelerated so that the potential of line $\overline{SAN}$ drastically drops to the ground potential Vss from the precharged potential Vp, as shown in FIG. 4A. The broken line in this figure represents a change in potential on line $\overline{SAN}$ in the prior art case.

Figure 4B:
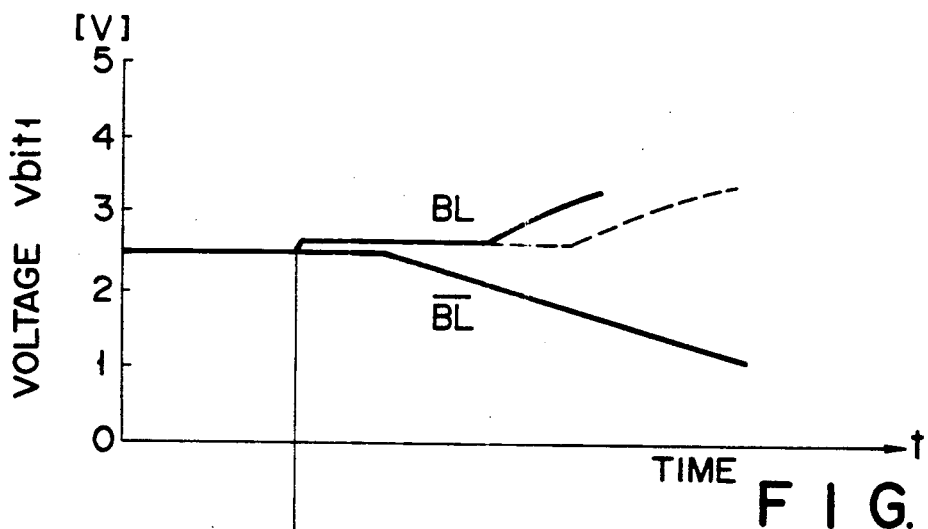

During a certain time period of discharging of the charges on bit lines BL1, BL2, ..., BLn with "1" data, MOSFET Q2 of sense amplifier SA1 of bit line BL0 is kept nonconductive. That is, the read data of the target column is not sensed until the discharging is executed for a predetermined discharge level. A change in potential Vbit1 of bit line pairs BL1, $\overline{BL1}$, BL2, $\overline{BL2}$, ..., BLn, $\overline{BLn}$ associated with the column of "1" data is illustrated in FIG. 4B wherein the solid lines are of the present invention and the broken line is of the prior art.

Figure 4C:
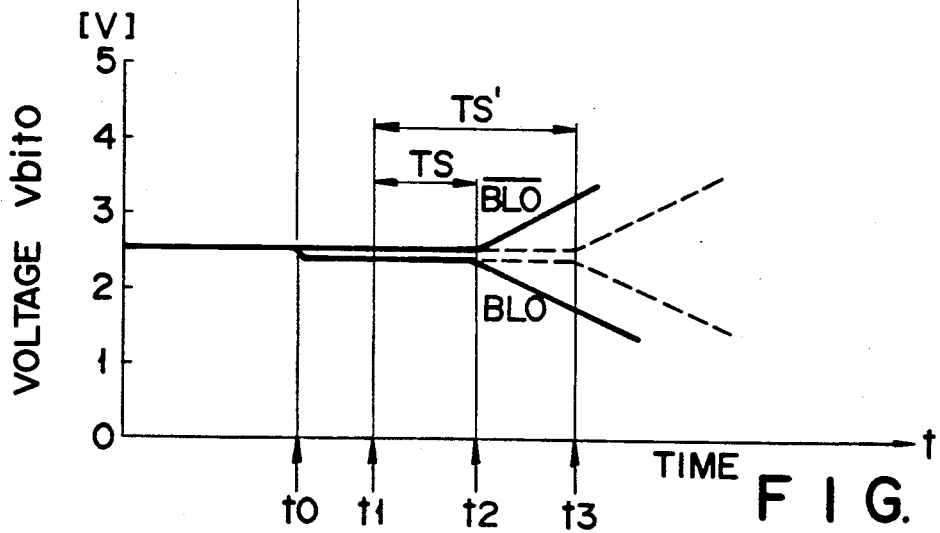

In the DRAM 10, the discharging of carriers from the bit lines of non-selected columns has been carried out at time t2, at which MOSFET Q2 of sense amplifier SA1 of the target column is therefore turned on. At this time, the sense operation starts and data "0" is read out. FIG. 4C shows a change in potential Vbit0 at bit line pairs BL0, $\overline{BL0}$. The interval TS between times t1, t2 corresponds to the actual "sense delay" in the target column. As should be obvious from the graph in FIG. 4C, the "sense delay" interval TS of the present invention, indicated by the solid lines, is shorter than the "sense delay" interval TS' of the prior art, indicated by the broken lines. This means an increase in the accessing speed of DRAM 10.

Providing the discharge current paths from the bit lines at a number of locations in the row direction in DRAM 10 can equivalently reduce the line resistances of the discharge paths. As a result, the clamp potential can be dropped and the discharge time constant can be made smaller at the same time, thus ensuring the shortening of the sense time of the column bar pattern.

The possible factors to determine the resistance of common source line $\overline{SAN}$ are the turn on-resistances of drive transistor Qm of main sense amplifier driver 14 and drive transistors Qs of subsense amplifier drivers 24, and line resistors R1, R2, R31, R32, ... of line $\overline{SAN}$. The former turn-on resistance is determined mainly by the gate widths of the respective transistors. The gate width of drive transistor Qs of subsense amplifier driver 24 cannot be set larger than that of drive transistor Qm of main sense amplifier driver 14 in view of the layout area; naturally, the turn-on resistance of each transistor Qs is larger than that of transistor Qm. In accordance with high integration of DRAM 10, however, word lines WL becomes longer and number of snap regions 46 per word line increases, thus making it possible to reduce the total ON resistance of the parallel-connected drive transistors Qs of those subsense amplifier drivers 24 which are provided according to the increase in the quantity of snap regions 46. Accordingly, the total turn-on resistance of parallel-connected transistors Qs can be made smaller.

With regard to the latter line resistors R1, R2, R31, R32, on the other hand, the resistance of each of resistors R31, R32 is larger than the resistance (R1+R2) because common source line $\overline{SAN}$ is wider and longer at the portion of subsense amplifier driver 24 than at the portion of main sense amplifier driver 14. Like in the case of the turn-on resistances, providing a number of the lines in parallel can make the total line resistance smaller.

The above design feature can significantly reduce the resistance of common source line $\overline{SAN}$ to the desired level. FIGS. 4A to 4C illustrate changes in potential on the "1" data bit line pair and "0" data bit line pair; the solid lines in the figures represent data of the present invention while the broken lines represent the results of measurement in the prior art. As should be obvious from these graphs, the clamp potential is reduced and the discharge time constant is smaller than that of the prior art. Accordingly, transistor Q1 of the sense amplifier of the column with "0" data is turned on at a quick timing.

The structure to "accelerate charge discharging" of the present invention needs at least a pair of a subsense amplifier driver 24 and a potential applying line 26. A considerably high speed operation can be expected even from a single pair of a subsense amplifier driver 24 and a potential applying line 26, although the effect would naturally be increased with an increase in the number of such pairs. In the case of a single pair, the discharge current may be uniformly distributed by providing subsense amplifier driver 24 and potential applying line 26 at the opposite end of common source line $\overline{SAN}$ to that portion where main column select driver 14 is connected.

A combination of the feature of this "additional provision of the branching discharge path" and the feature of the "layout to save the substrate area," which has been described referring to FIGS. 2 and 3 can realize high-speed DRAMs at a low cost with the presently available fabrication technique while keeping a satisfactory high integration.

Although the above embodiment uses the NMOS sense amplifier to sense cell data, a PMOS sense amplifier may also be used as in a DRAM of FIG. 5. The fundamental operation of DRAM 60 is the same as that of the DRAM using an NMOS sense amplifier, except that the potential of common source line $\overline{SAN}$ is raised to the source voltage Vcc, not the ground potential Vss, from the precharged potential Vp, to thereby activate sense amplifiers SA and that the line for applying a potential to main sense amplifier driver 14 and the distributed subsense amplifier drivers 24 is a power line, not the ground line.

Figure 6:
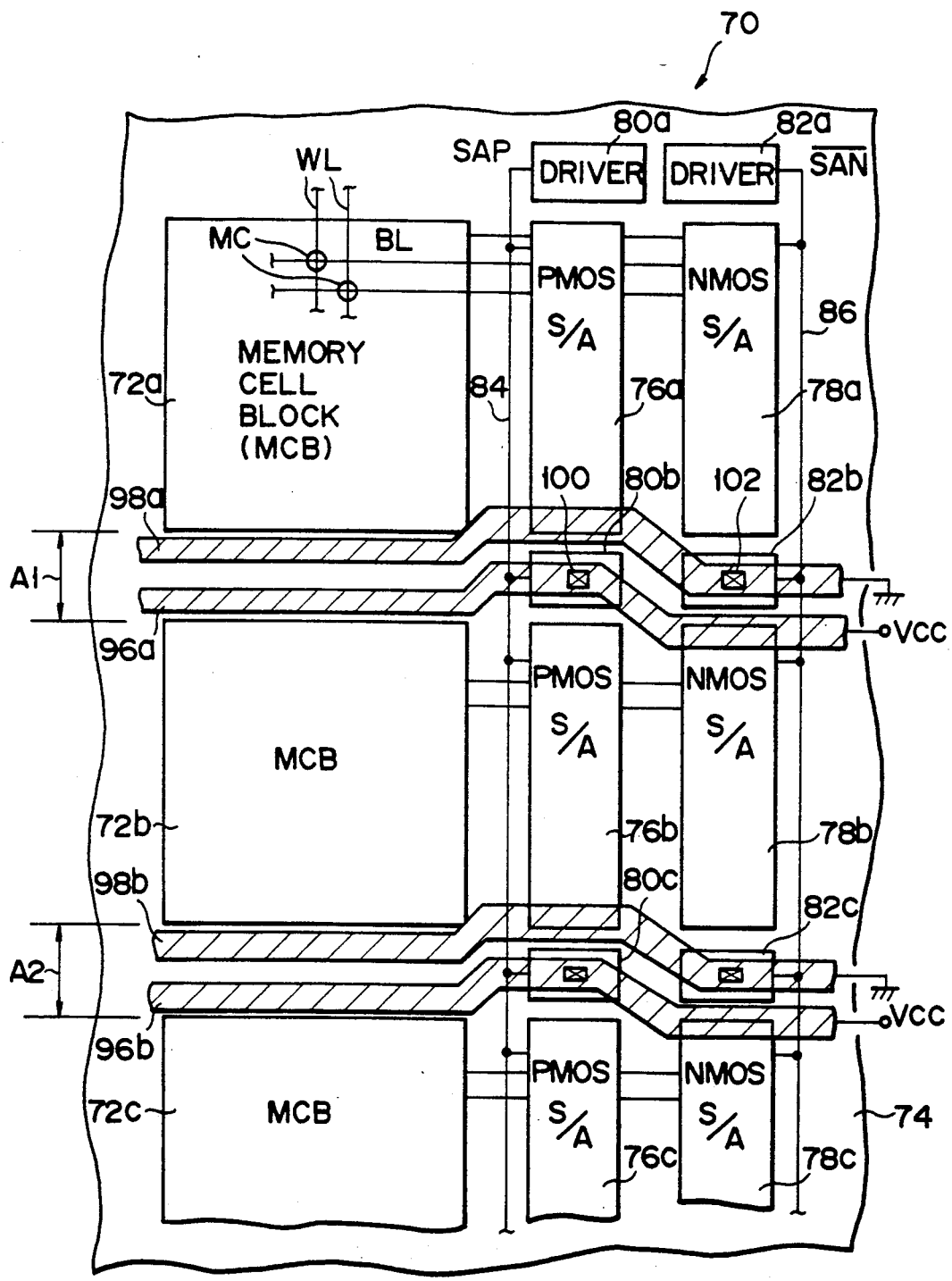
FIG. 6 is a diagram showing the plan view of the main section of a dynamic random-access memory in accordance with a further embodiment of this invention.

Turning now to FIG. 6, a DRAM in accordance with a further embodiment of the present invention is generally designated by reference numeral "60." This DRAM 60 includes an array 72 of memory cells is divided into a plurality of groups 72a, 72b, 72c, ... of memory cells MC on a substrate 74. These cell blocks are called the "cell blocks." Each of cell blocks 72 includes rows and columns of memory cells, each of which consists of one capacitor and one MOS transistor. In each cell block 72, control lines (word lines) and data transfer lines (bit lines) are insulatively intersect each other on substrate 74 in a manner that word lines WL are connected to the columns of memory cells MC and bit lines are associated with the rows of memory cells MC. As illustrated in FIG. 6, memory cell blocks 72 are aligned along the extending direction of parallel word lines WL. An interspace or gap space A1, A2, ... exists between every two adjacent ones of memory cell blocks 72 on the surface of substrate 74. The space is generally called the "word-line snap area."

A linear array of P-channel MOS (PMOS) sense amplifier circuits 76a, 76b, 76c, ... are arranged near memory cell blocks 72a, 72b, 72c, ... on substrate 74. Each PMOS sense amplifier circuit 76 is associated with a corresponding memory cell block. An array of N-channel MOS (NMOS) sense amplifier circuits 78a, 78b, 78c, ... are also arranged on substrate 74 such that they are located in the vicinity of PMOS sense amplifier circuits 76. These NMOS sense amplifier circuits 78 are associated with memory cell blocks 72, respectively.

A circuit for electrically driving the PMOS sense amplifier circuits 76a, 76b, 76c includes a plurality of sub-driver circuits 80a, 80b, 80c, ... These sub-drivers 80 are specifically arranged as follows: These are distributed among PMOS sense amplifier circuits 84 on substrate 74 to be located at the peripheral positions near the both ends of sense-amplifier array 76, and at midway positions each of which is defined between every two adjacent circuits 76. Midway positions may spatially correspond to crossing surface areas of areas A1, A2, ... and sense-amplifier array 76. As a result, as apparent from the illustration of FIG. 6, these components 76, 80 are alternately positioned along a positioning line on the substrate surface. Each sub-driver 80 includes a PMOS transistor (not shown in FIG. 6). Sub-driver 80 will be referred to as "PMOS drivers" hereinafter.

A drive circuit for the NMOS sense amplifier circuits 78a, 78b, 78c is similar to that for PMOS sense amplifier circuits 76 with MOS PMOS transistors being replaced with NMOS transistors. NMOS drivers 82a, 82b, 82c, ... and NMOS sense amplifier circuits 78 are alternately located along another positioning line on substrate 74, as shown in FIG. 6. PMOS drivers 80 are connected by a wiring line 84 to PMOS sense amplifier circuits 76; this wiring line 84 may be called the "common drive line." Similarly, NMOS drivers 82 are connected by another common drive line 86 to NMOS sense amplifier circuits 78.

Figure 7:
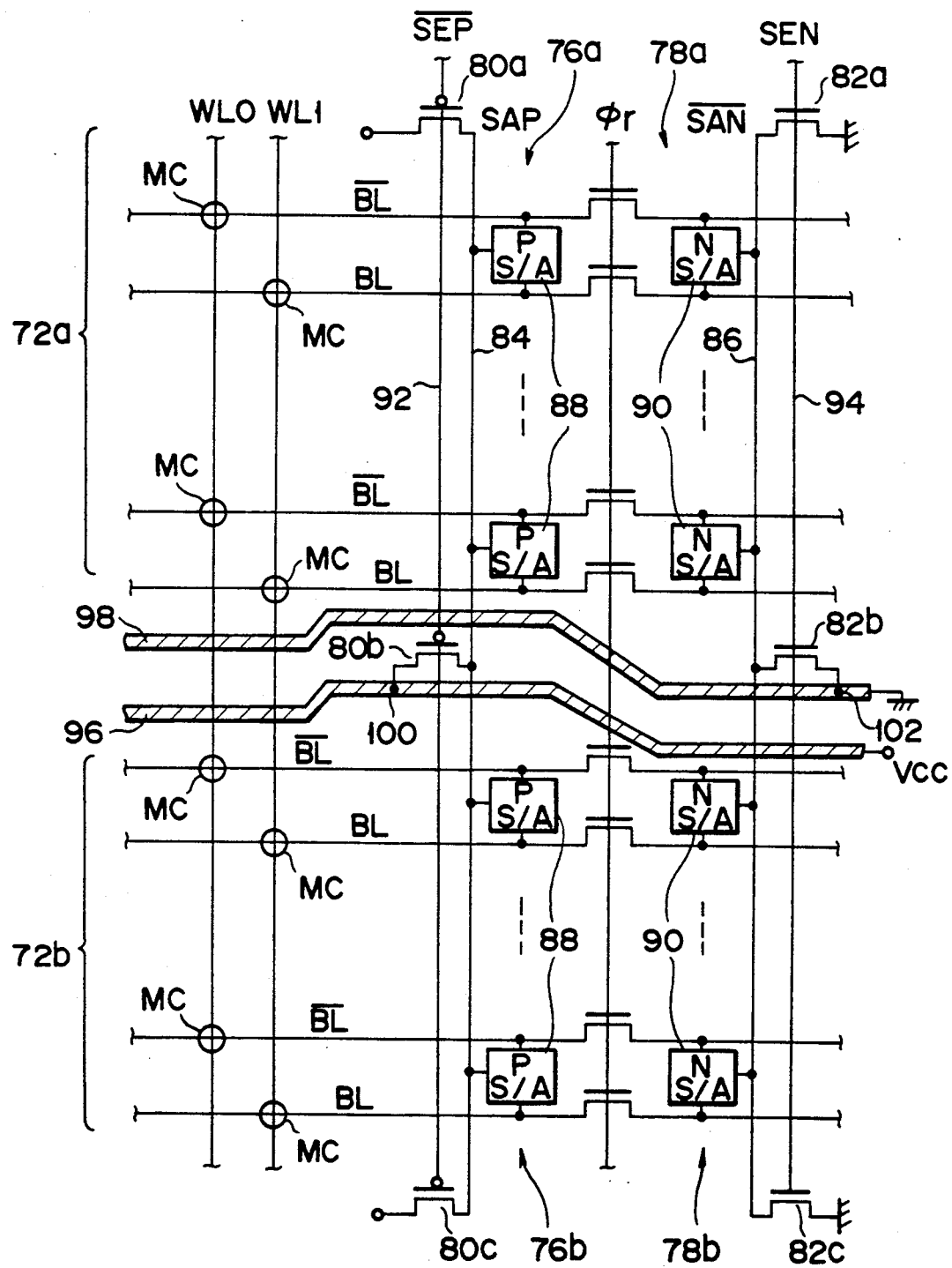
FIG. 7 is a circuit diagram of the embodiment shown in FIG. 6.

The equivalent circuit configuration of the embodiment of FIG. 6 is partially shown in FIG. 7, wherein the memory cell blocks 72a, 72b are associated in common with parallel word lines WL0, WL1, ... as illustrated. In each memory cell block 72, a preselected number of bit lines BL, $\overline{BL}$ insulatively intersect word lines WL, thereby to provide a plurality of crossing points therebetween. At these points a number of one-capacitor-/one-transistor memory cells MC are arranged in a known manner.

Each of PMOS sense amplifier circuits 76a, 76b includes a plurality of PMOS sense amplifiers 88, which are connected to the bit line pairs, respectively, and have source nodes to be connected to drive line 84. Each of PMOS sense amplifiers 88 may be a flip-flop circuit which includes a pair of PMOS transistors having source and drain electrodes cross-coupled to each other. Each NMOS sense amplifier circuit 78a, 78b includes a corresponding numbers of NMOS sense amplifiers 90. These amplifiers 90 have source nodes that are connected together to the other driver line 86. Each NMOS sense amplifier 90 may be a pair of cross-coupled NMOS transistors.

As apparent from FIG. 7, PMOS drivers 80a, 80b, 80c consist of PMOS transistors, respectively. These PMOS transistors 80 have the drain electrodes connected in common to drive line 84. The gate electrodes of NMOS transistors 80 are connected to a control line 92, on which a control signal $\overline{SEP}$ is supplied. NMOS drivers 82a, 82b, 82c consist of PMOS transistors respectively. These NMOS transistors 82 have the drain electrodes which are connected together with common drive line 86. The gate electrodes of PMOS transistors 82 are connected with each other by another control line 94, on which another control signal i to be supplied.

PMOS transistor 80 and NMOS transistor 82 which are arranged in an extension area of each snap area A1, A2, ... are provided with source voltage supply lines 96, 98 (power supply voltage Vcc line 96 and ground potential line 98) respectively. These lines may be aluminum wiring lines. Typically, the Vcc line 96 extends to be directly connected to the source electrode of PMOS driver transistor 80b in the circuit configuration of FIG. 7. The ground line 98 is directly connected to the source electrode of NMOS driver transistor 82b. An electrical contact between PMOS transistor 80b and Vcc line 96 is made by a contact section 100. Another contact section 102 is for causing the NMOS transistor to be connected with ground line 98.

Very importantly, the power supply voltage Vcc line 96 and ground line 98 are respectively provided for every pair of the distributed PMOS and NMOS driver transistors 80, 82 which are provided corresponding to the word-line snap areas A. Furthermore, as illustrated in FIG. 6 most descriptively, each pair of Vcc line 96 and ground line 98 have a specific wiring pattern wherein these lines extend linearly in a corresponding snap area A and are then curved partially in the extension area thereof. More specifically, ground line 98a runs straight in parallel with the bit line pairs BL, $\overline{BL}$ in a snap area A1, and are then curved so as to approach PMOS sense amplifier circuit 76a. In other words, ground line 98a extend around PMOS driver 80b by roundabout way to be connected by contact section 102 to NMOS driver 82b. On the other hand, the associated Vcc line 96a runs straight in word-line snap area A1 in parallel with ground line 98a, and is curved partially along the curved pattern of line 98a to approach contact section 100, at which line 96a is electrically connected with PMOS driver 80b. Line 96a extends while it keeps a constant distance or interval from curved line 98a. Pair of lines 96b, 98b in another snap area A2 is arranged similarly.

Figure 8:
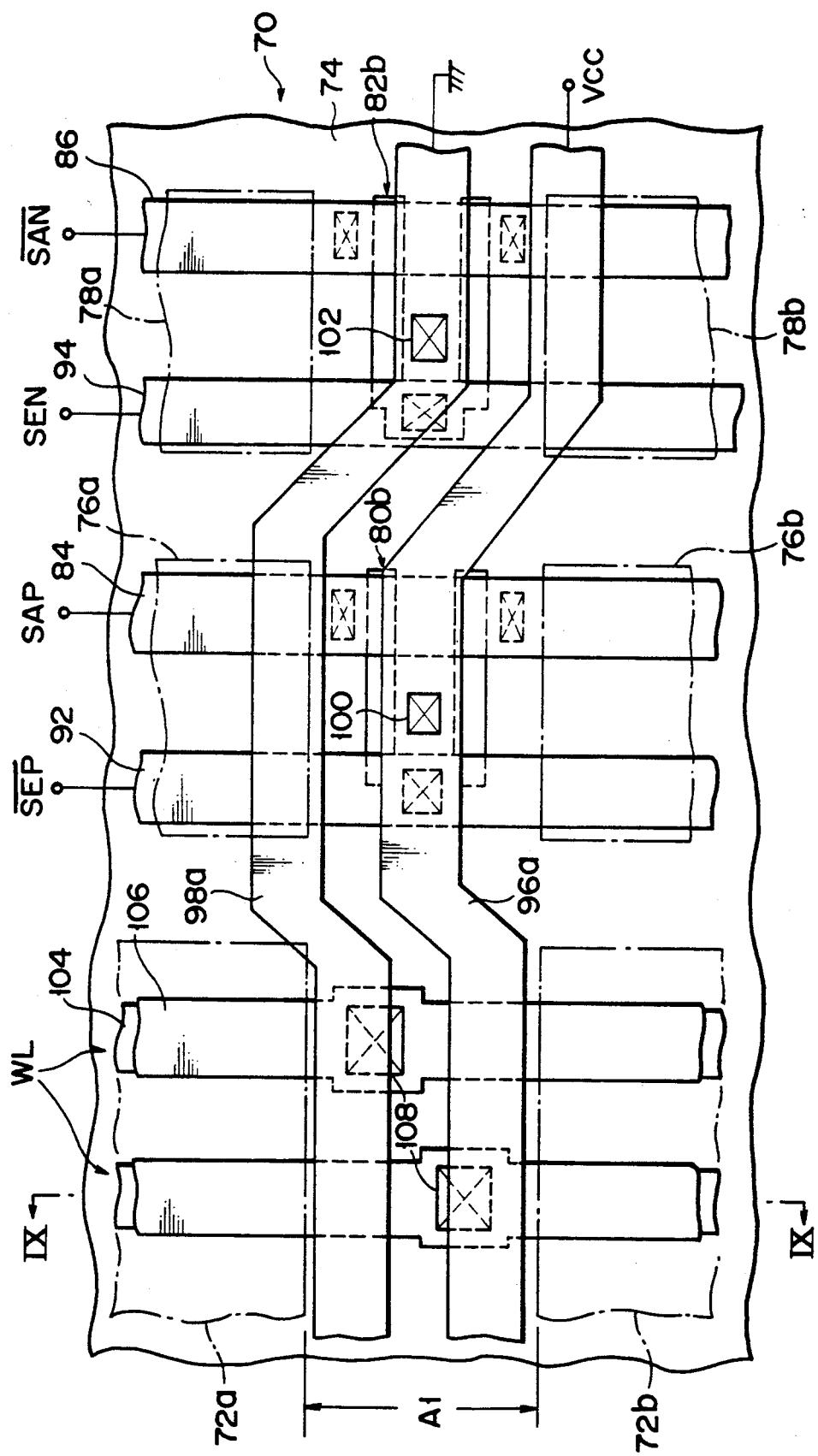
FIG. 8 is a diagram showing an enlarged plan view of the main section of the embodiment shown in FIG. 6.

FIG. 8 shows the enlarged patterning layout of the above power supply voltage Vcc line 96a and ground line 98a on substrate 75 of DRAM 70, wherein the contact sections 100, 102 for PMOS and NMOS driver transistors 80b, 82b on lines 96a, 98a are illustrated by thin solid line only for the purposes of enhancing the visualization of drawing.

Figure 9:
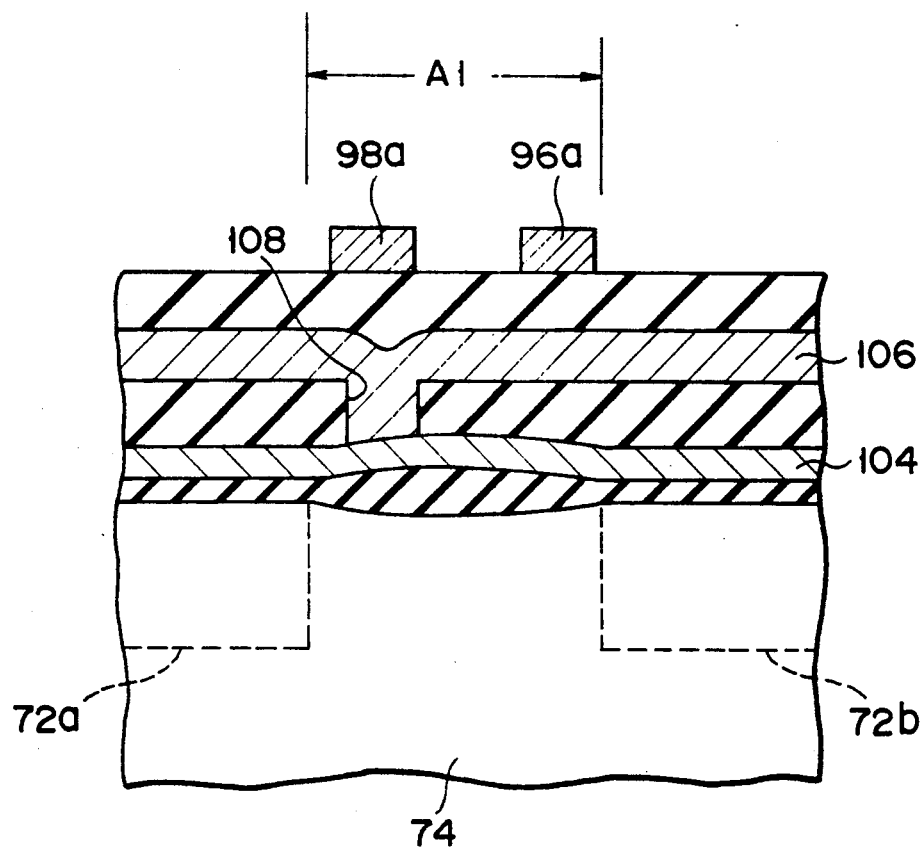
FIG. 9 is a diagram showing a cross-sectional structure of the embodiment of FIG. 8 along line IX—IX.
Figure 10:
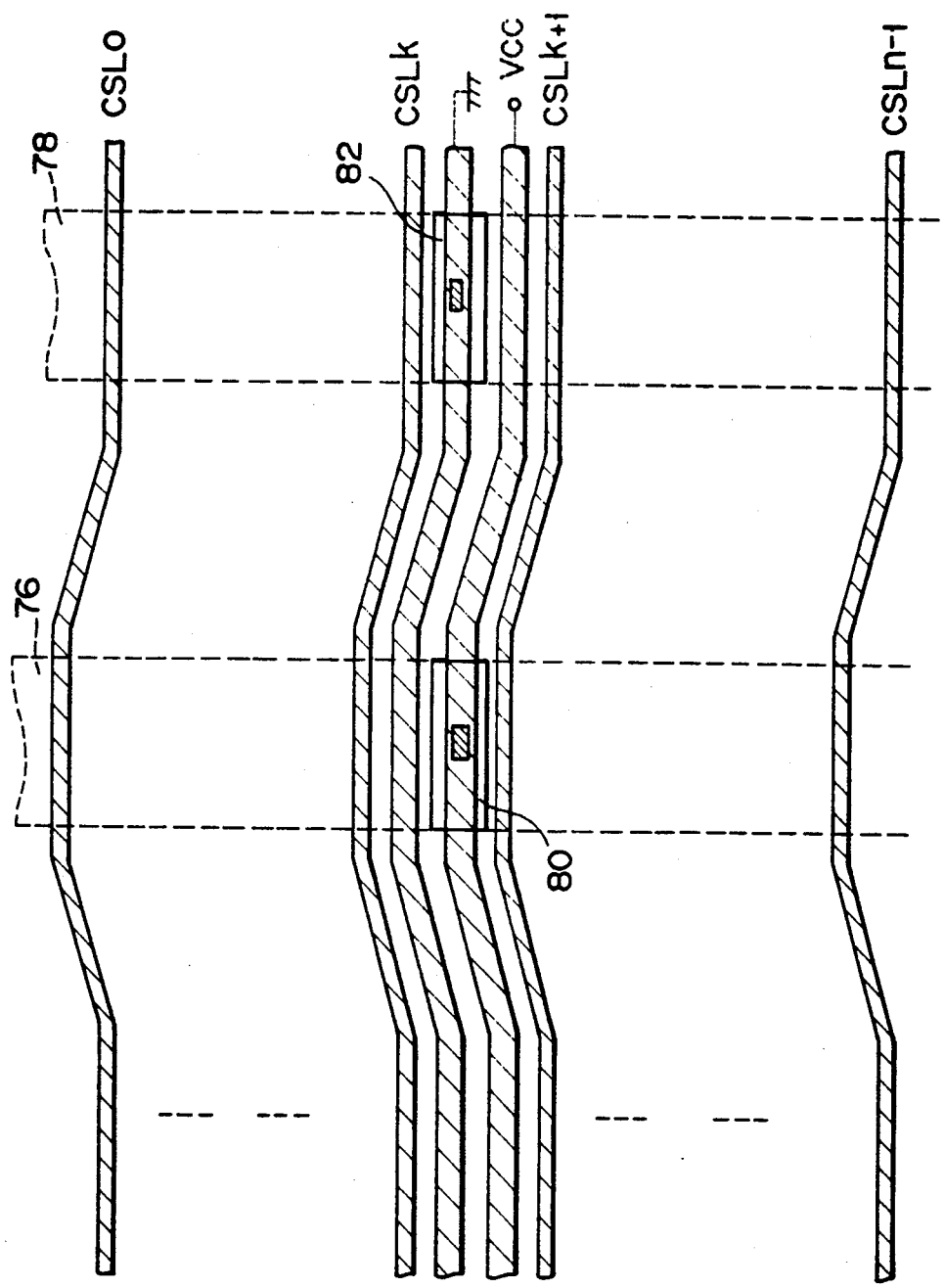
FIG. 10 is a diagram schematically showing a wiring pattern of column-select lines employed in the embodiment of FIG. 6.

As shown in FIG. 8, each of word lines WL has a double-layered structure consisting of a polycrystalline silicon layer and a metal wiring line. More specifically, each word line WL consists of a polycrystalline silicon layer 104 serving as the gate electrodes of the columns of memory cell transistors, and an aluminum wiring line 106 which insulatively overlies layer 104. These layers 104, 106 are electrically coupled with each other by a plurality of contact sections 108—only one of them is visible in each word line WL in FIG. 8—which are arranged at a constant interval. The underlying aluminum wiring lines 104 are formed in a certain level over substrate 74, the level being different from that of the previously described aluminum wiring lines 96, 98. Sense-amplifier drive lines 84, 86 may be aluminum wiring lines, which are formed in the same level as lines 104 over substrate 74, and which are in contact with the drain electrodes of PMOS and NMOS driver transistors 80b, 82b, respectively. Control lines 92, 94 which are in contact with the gate electrodes of these drive transistors 80b, 82b and to which control signals are applied respectively may be aluminum wiring lines that are formed in the same level as aluminum wiring lines 104 of word lines WL over substrate 74. The stacked or laminated structure of a typical word line WL is shown in detail in FIG. 9. Additionally, as a result of use of the partially curved source voltage supply lines 96, 98, it may be preferably arranged that the column-select lines CSL0, ..., CSLk, CSLk+1, ..., CSLn−1 to be associated with memory cell blocks 72 are also partially curved similarly. These lines CSL may be aluminum wiring lines which are formed in the same level as lines 96, 98 over substrate 74.

With the DRAM 60 shown in FIGS. 6 through 10, the bit-line current in a read mode flows into corresponding source voltage lines (ground lines) 98 in a distributed manner in via a number of distributed NMOS driver transistors 82a, 82b, 82c, ... as typically shown in FIG. 6. It is therefore possible to eliminate undesirable on-line current variation which will be caused due to the inherent resistance of drive line for NMOS sense amplifier circuit 78a, 78b, 78c, ..., i.e., $\overline{SAN}$ line 86, with the result of the voltage potential on this line 86 being uniform. This can speed u the operation of NMOS sense amplifier circuits 78, enabling the accessing speed of DRAM 60 to be improved significantly. For the same reason, the operation of PMOS sense amplifier circuits 76 can also be improved, since the current flowing into these sense amplifier circuits is also forced to flow into the other source voltage lines (Vcc lines) 96 which are associated with the distributed PMOS driver transistors 80a, 80b, 80c. Improving the operation speed of PMOS sense amplifier circuits may lead to improvement in the restore operation of DRAM 60. The above high-speed improvement in both the access operation and the restore operation is very significant, since it can contribute to the total improvement in the operating speed of DRAM 60 being highly integrated.

Figure 11:
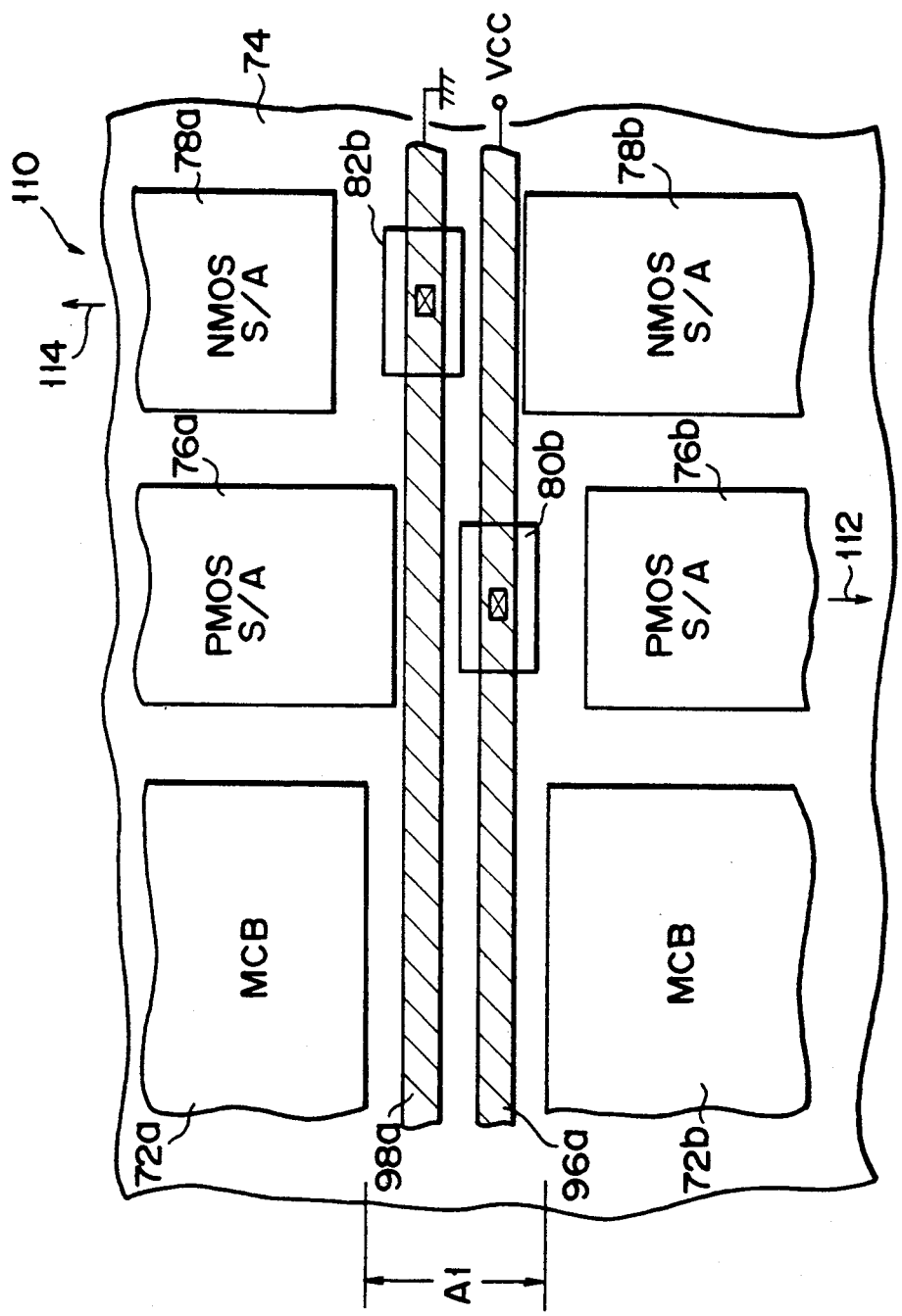
FIG. 11 is a diagram showing a plan view of a modification of the DRAM shown in FIG. 6.

The DRAM 60 may be modified as shown in FIG. 11, wherein a DRAM 110 has source voltage lines 96, 98 which are straight wiring lines. To enable this, it is required that, while the occupation area of each of PMOS and NMOS sense amplifier circuits 76, 78 is decreased, the layout of these circuits on substrate 74 is modified as follows: The array of PMOS sense amplifier circuits 76 are moved along an arrow 112 on the substrate surface, and the array of NMOS sense amplifier circuits 78 are moved along an arrow 114 of the opposite direction. With such an arrangement, the wiring pattern of DRAM 110 can be simplified, which may lead to decrease in the risk of patterning defects in DRAM 110.

Figure 12:
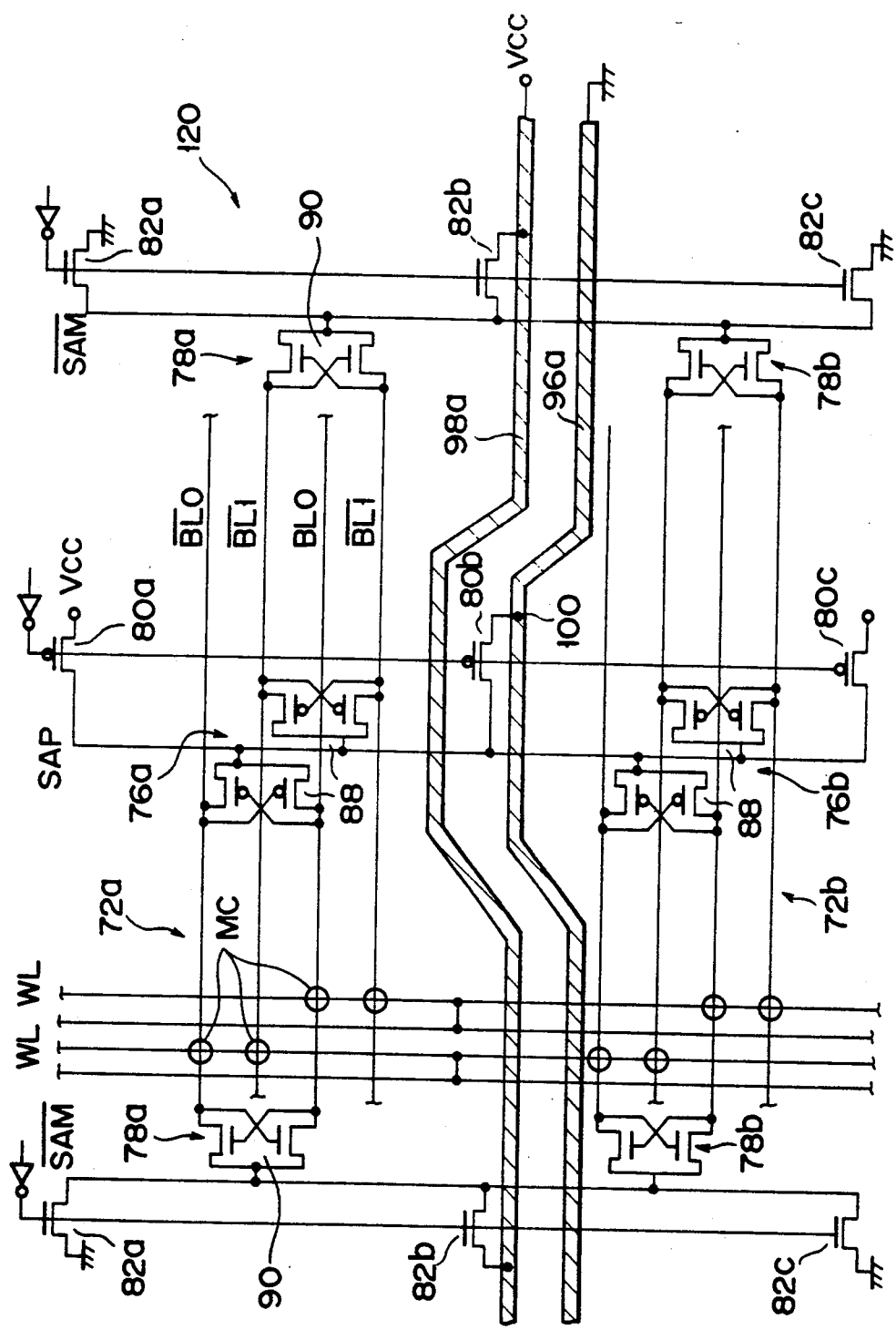

The circuit configuration of a DRAM 120 of FIG. 12 is similar to that shown in FIG. 7 except for the following arrangements: (1) the bit line pairs BL, $\overline{BL}$ are of an interlaced line configuration; and (2) the positions of PMOS and NMOS sense amplifier circuits 76, 78 are different. Details of the interlaced bit line pair are as follows. In memory cell block 72a, a certain pair of bit lines BL0, $\overline{BL0}$ an adjacent pair of bit lines BL1, $\overline{BL1}$ neighboring thereto extend in parallel with one another and are alternately positioned as shown in FIG. 12. NMOS sense amplifier circuits 78a associated with these two bit line pairs include NMOS sense amplifiers 90 which are arranged at the opposite ends thereof. PMOS driver transistors 82 are divided into two subarrays in accordance with the alternate positioning of PMOS sense amplifiers 88. The same goes with memory cell block 72b. Each PMOS sense amplifier circuit 76 is located at substantially the center position of a corresponding memory cell block 72 as shown in FIG. 12.

The layout of PMOS and NMOS drivers 80, 82 and source voltage lines 96, 98 associated therewith in a DRAM 130 of FIG. 13 is similar to that shown in FIG. 6 except for the following arrangement: PMOS drivers 80 are added to selected snap areas A1, A3, ..., Ai (i is an odd integer), whereas NMOS drivers 82 are arranged in the remaining snap areas A2, A4, ..., Aj (j is an even integer). In other words, each snap area is provided with either one of PMOS driver 76 and NMOS drivers 78. In accordance with such alternate layout of PMOS/NMOS drivers, each snap area is provided with either one of source voltage lines 96, 98 only. For example, snap area A1 is provided with Vcc line 96 adapted to be connected to PMOS driver 80; no ground line 98 is formed therein. A neighboring snap area A2, by contrast, is provided with ground line 98 to be connected to NMOS driver 82; there is no Vcc line 96 therein. This source voltage line arrangement will be repeated with respect to the remaining snap areas in DRAM 130.

With such an arrangement, although the distribution effect of sense-amplifier current is degraded by little compared to the previously described embodiments shown in FIGS. 6 through 12, the layout of DRAM components on substrate 74 can be simplified since only one source voltage line is required to be added to each snap area. This advantage will be very significant especially when the integration density of DRAM is further improved. In addition, since the source voltage line extending in each snap area can be fat, the resistance thereof can be decreased to speed up the sense operation, with the result in the total operation speed being enhanced.

The present invention is not limited to the above-described specific embodiments and may be practiced or embodied in still other ways without departing from the spirit or essential character thereof.

What is claimed is:

1. A semiconductor memory device comprising:
    a substrate;
    an array of memory cells arranged on said substrate and subdivided into a plurality of cell groups each of which includes memory cells arranged in rows and columns;
    data transfer lines and control lines associated with the rows and columns of memory cells on said substrate;
    first sense amplifier sections each of which is connected to said data transfer lines in a corresponding one of said cell groups, and which comprises first metal insulator semiconductor field effect transistors of a first conductivity type;
    second sense amplifier sections each of which is connected to said data transfer lines in a corresponding cell group, and which comprises second metal insulator semiconductor field effect transistors of a second conductivity type opposite to the first conductivity type;
    first driver means for electrically driving said first sense amplifier sections, said first driver means comprising a plurality of driver transistors of the first conductivity type which are put among said first sense amplifier sections on said substrate;
    second driver means for electrically driving said second sense amplifier sections, said second driver means comprising a plurality of driver transistors of the second conductivity type which are put among said second sense amplifier sections on said substrate; and
    power-feed means connected to both of said first and second driver means, for supplying first and second source potentials to said first and second driver means independently of each other.

2. The device according to claim 1, wherein said power-feed means comprises:
    first wire means arranged in a first level above said substrate and connected to said first driver means; and
    second wire means arranged in the first level above said substrate and connected to said second driver means.

3. The device according to claim 2, wherein said first wire means comprises a wiring line which extends along said data transfer lines in a substrate surface region which is defined in two adjacent ones of said cell groups.

4. The device according to claim 2, wherein said second wire means comprises a wiring line which extends along said data transfer lines in a substrate surface region which is defined in two adjacent ones of said cell groups.

5. The device according to claim 2, wherein said first wire means comprises a first wiring line and said second wire means comprises a second wiring line, said first and second wiring lines extending in parallel with each other along said data transfer lines in a substrate surface region which is defined in two adjacent ones of said cell groups.

6. The device according to claim 3, wherein said wiring line is curved at least partially.

7. The device according to claim 4, wherein said wiring line is curved at least partially.

8. The device according to claim 5, wherein said first and second wiring lines are curved at least partially.

9. The device according to claim 3, further comprising:
    a first drive line for electrically connecting said first driver means with said first sense amplifier sections; and
    a second drive line for electrically connecting said second driver mean with said second sense amplifier sections, said first and second drive lines being transverse to said wiring line and arranged in the second level above said substrate.

10. The device according to claim 4, further comprising:
- a first drive line for electrically connecting said first driver means with said first sense amplifier sections; and
- a second drive line for electrically connecting said second driver means with said second sense amplifier sections, said first and second drive lines being transverse to said wiring line and arranged in the second level above said substrate.

11. The device according to claim 5, further comprising:
- a first drive line for electrically connecting said first driver means with said first sense amplifier sections; and
- a second drive line for electrically connecting said second driver means with said second sense amplifier sections, said first and second drive lines being transverse to said first and second wiring lines and arranged in a second level above said substrate.

12. A dynamic random-access memory comprising:
a semiconductive substrate;
a plurality of spaced-apart memory cell blocks on said substrate, each of said memory cell blocks including rows and columns of memory cells arranged in a matrix;
parallel bit lines connected to the rows of memory cells;
parallel word lines transverse to said bit lines and connected to the columns of memory cells;
P-channel metal oxide semiconductor (PMOS) sense amplifier sections associated with said memory cell blocks respectively on said substrate;
N-channel metal oxide semiconductor (NMOS) sense amplifier sections associated with said memory cell blocks respectively on said substrate;
PMOS driver means connected to said PMOS sense amplifier sections, for electrically driving the same, said PMOS driver means including a plurality of first driver transistors which are distributed among said PMOS sense amplifier sections such that a first driver transistor is located between two neighboring ones of said PMOS sense amplifier sections;
NMOS driver means connected to said NMOS sense amplifier sections, for electrically driving the same, said NMOS driver means including a plurality of second driver transistors which are distributed among said NMOS sense amplifier sections such that a second driver transistor is located between two neighboring ones of said NMOS sense amplifier sections; and
source voltage supply means connected to said PMOS and NMOS driver means, for supplying said PMOS and NMOS driver means with a first and a second source voltage independently of each other.

13. The memory according to claim 12, wherein said word lines comprise first wiring lines which are formed in a first level over said substrate, and said source voltage supply means comprises a second and a third wiring line transverse to said first wiring lines and being formed in a second level over said substrate.

14. The memory according to claim 13, wherein at least one of said second and third wiring lines is located in a substrate surface area which is defined between two neighboring ones of said memory cell blocks.

15. The memory according to claim 14, wherein said first driver transistors comprise PMOS transistors, while said second driver transistors comprise NMOS transistors.

16. The memory according to claim 14, wherein said second and third wiring lines are curved at least partially in a plane at the second level.

17. The memory according to claim 14, wherein said second and third wiring lines extend linearly in parallel with said bit lines.

* * * * *